(12) United States Patent
Noh

(10) Patent No.: US 6,624,622 B2
(45) Date of Patent: Sep. 23, 2003

(54) PROBE FOR MEASURING VOLTAGE/ CURRENT OF LOW VOLTAGE POWER DISTRIBUTION CABLE

(75) Inventor: Seung-Man Noh, Puchon-Si (KR)

(73) Assignee: Korea Electric Power Data Network Co. Ltd., Seoul (KR)

( * ) Notice: Subject to any disclaimer, the term of this patent is extended or adjusted under 35 U.S.C. 154(b) by 21 days.

(21) Appl. No.: 10/072,146

(22) Filed: Feb. 7, 2002

(65) Prior Publication Data

US 2003/0080722 A1 May 1, 2003

(30) Foreign Application Priority Data

Oct. 30, 2001 (KR) ........................................ 2001-67166

(51) Int. Cl.[7] ........................... G01R 31/02; H01F 27/26
(52) U.S. Cl. ................... 324/72.5; 324/117 R; 324/127
(58) Field of Search ............................... 324/72.5, 127, 324/117 R, 129, 117 H; 702/64, 62

(56) References Cited

U.S. PATENT DOCUMENTS

| 4,227,145 A | 10/1980 | Bonikowski et al. ......... 324/51 |
| 6,064,192 A | * 5/2000 | Redmyer .................... 324/127 |

FOREIGN PATENT DOCUMENTS

| EP | 0241832 A1 | 10/1987 |
| EP | 088533364 A2 | 7/1998 |

* cited by examiner

Primary Examiner—John E. Chapman
Assistant Examiner—James C. Kerveros
(74) Attorney, Agent, or Firm—Seth Natter; Natter & Natter

(57) ABSTRACT

Disclosed herein is a probe for measuring voltage/current of a low voltage power distribution cable. A probe has a body having a first opening and a first recess and made of an insulating material. A lower core is inserted into the first recess of the body, and a coil is wound around an insulating material installed at the lower core for detecting an induction current. A capacitor and a resistor are connected between output lines extended from the coil so as to filter out noise components, and a ground line is electrically connected to one end of the lower core. A voltage detection terminal is electrically connected to the low voltage power distribution cable for detecting voltage applied to the low voltage power distribution cable. A voltage output line is used for outputting the detected voltage. A connector is connected to output sides of the output lines extended from the coil, the ground line and the voltage output line. An end plate is attached to the body for covering the first recess and provided with a second opening and a second recess. A top cover is mounted to the top surfaces of the body and the end plate by nuts interlocked with a fixed bolt fixedly mounted to the body and a movable bolt. An upper core is inserted in the top cover to be opposite to the lower core installed in the body.

5 Claims, 4 Drawing Sheets

PROBE FOR MEASURING VOLTAGE/CURRENT OF LOW VOLTAGE POWER DISTRIBUTION CABLE

BACKGROUND OF THE INVENTION

1. Field of the Invention

The present invention relates generally to probes for measuring voltage/current of low voltage power distribution cables, and more particularly to a probe for measuring voltage/current of a low voltage power distribution cable, in which sensors for respectively measuring voltage applied to the low voltage power distribution cable and current flowing through the low voltage power distribution cable are integrated into one structure.

2. Description of the Prior Art

Generally, various types of probes for measuring voltage/current of low voltage power distribution cables have been proposed and used. However, in most conventional probes for measuring voltage/current of a low voltage power distribution cable, a sensor for measuring voltage applied to a low voltage power distribution cable and a sensor for measuring current flowing through the power distribution cable are separately formed as respective units. Therefore, conventional probes are problematic in that it is difficult for a user to manipulate the probes, the constructions of the probes are complicated, and the voltage/current of the low voltage power distribution cable cannot be precisely measured due to the complicated constructions of the probes.

SUMMARY OF THE INVENTION

Accordingly, the present invention has been made keeping in mind the above problems occurring in the prior art, and an object of the present invention is to provide a probe for measuring voltage/current of a low voltage power distribution cable, which precisely measures the voltage/current of a low voltage power distribution cable.

Another object of the present invention is to provide a probe for measuring voltage/current of a low voltage power distribution cable, whereby the low voltage power distribution cable is easily detached from the probe.

Still another object of the present invention is to provide a probe for measuring voltage/current of a low voltage power distribution cable, in which probes for respectively measuring voltage and current are integrated into one structure so as to simultaneously measure voltage and current of the low voltage power distribution cable.

In order to accomplish the above object, the present invention provides a probe for measuring voltage/current of a low voltage power distribution cable, comprising a body having a first opening upwardly formed therein for receiving a low voltage power distribution cable and a first recess formed in the shape of a U around the first opening, and made of an insulating material; a lower core inserted into the first recess of the body and formed in the shape of a U; a coil wound around an insulating material installed at the lower core for detecting an induction current induced by means of current flowing through the low voltage power distribution cable; a capacitor connected between both end output lines extended from the coil to be parallel with the coil so as to filter out noise components; a resistor connected between the both end output lines extended from the coil to be parallel with the capacitor; a ground line electrically connected to one end of the lower core; a voltage detection terminal electrically connected to the low voltage power distribution cable for detecting voltage applied to the low voltage power distribution cable; a voltage output line for outputting the voltage detected by the voltage detection terminal; a connector connected to output sides of the both end output lines extended from the coil, the ground line and the voltage output line; an end plate attached to the body for covering the first recess, the end plate being provided with a second opening formed therein in approximately the same shape as the first opening formed in the body and a second recess formed therein in an approximate U shape both to cover the coil mounted in the first recess of the body and to receive a nut interlocked with the voltage detection terminal; a top cover mounted to the top surfaces of the body and the end plate by nuts interlocked with a fixed bolt fixedly mounted to the body and a movable bolt; and an upper core inserted in the top cover to be opposite to the lower core installed in the body.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
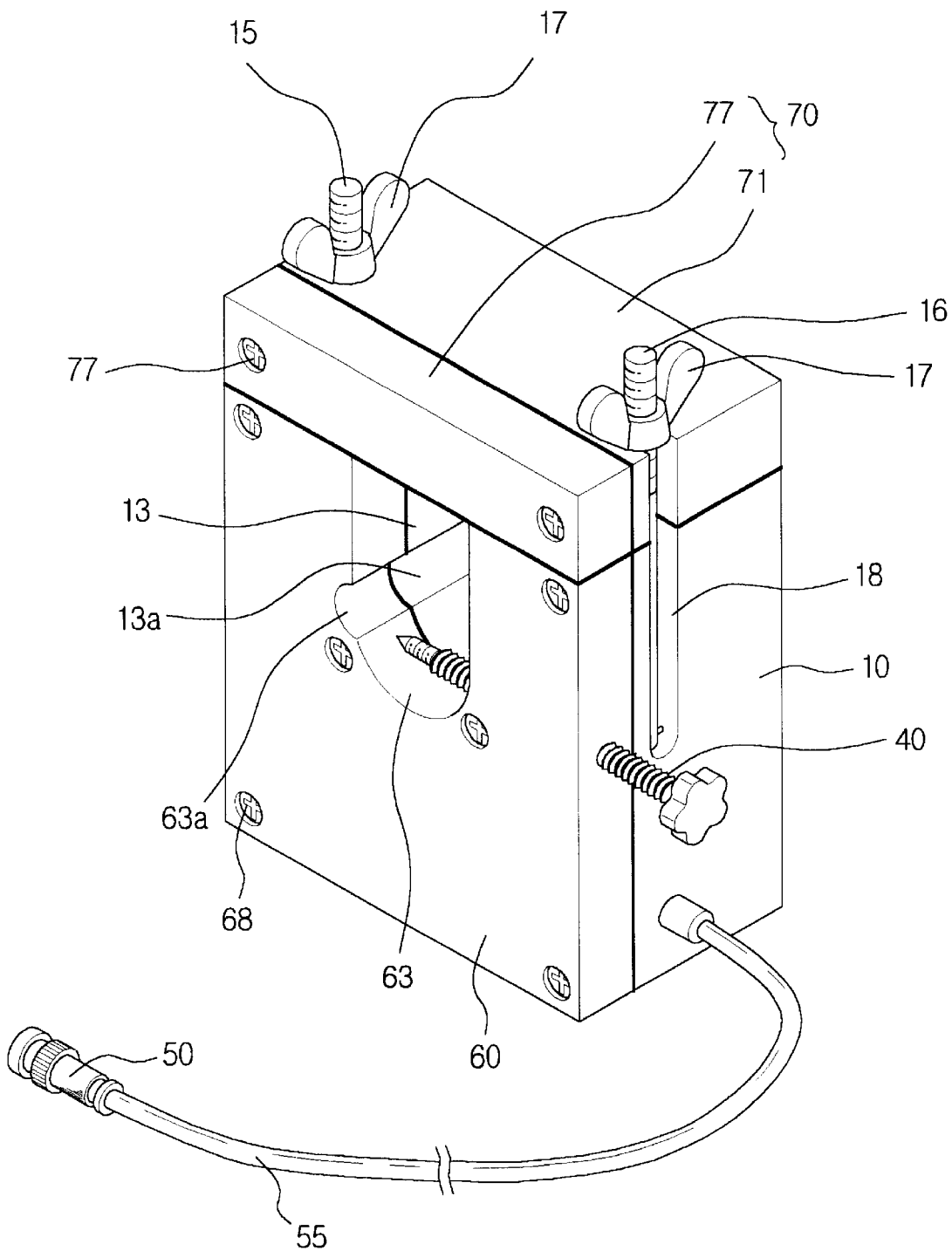
FIG. 1 is a perspective view showing a probe for measuring voltage/current of a low voltage power distribution cable according to a preferred embodiment of the present invention.
Figure 2:
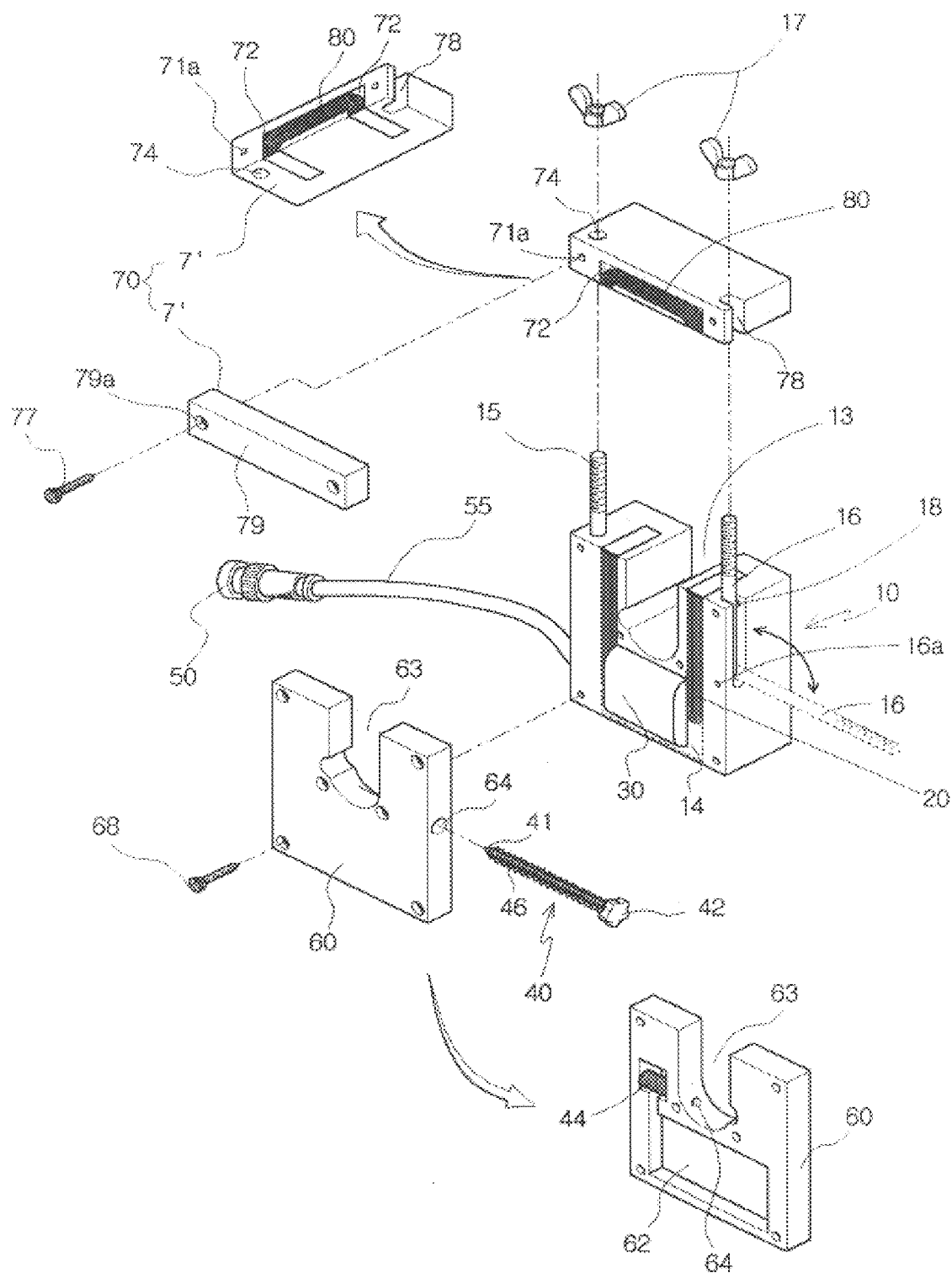
FIG. 2 is an exploded perspective view of the probe of FIG. 1.
Figure 3:
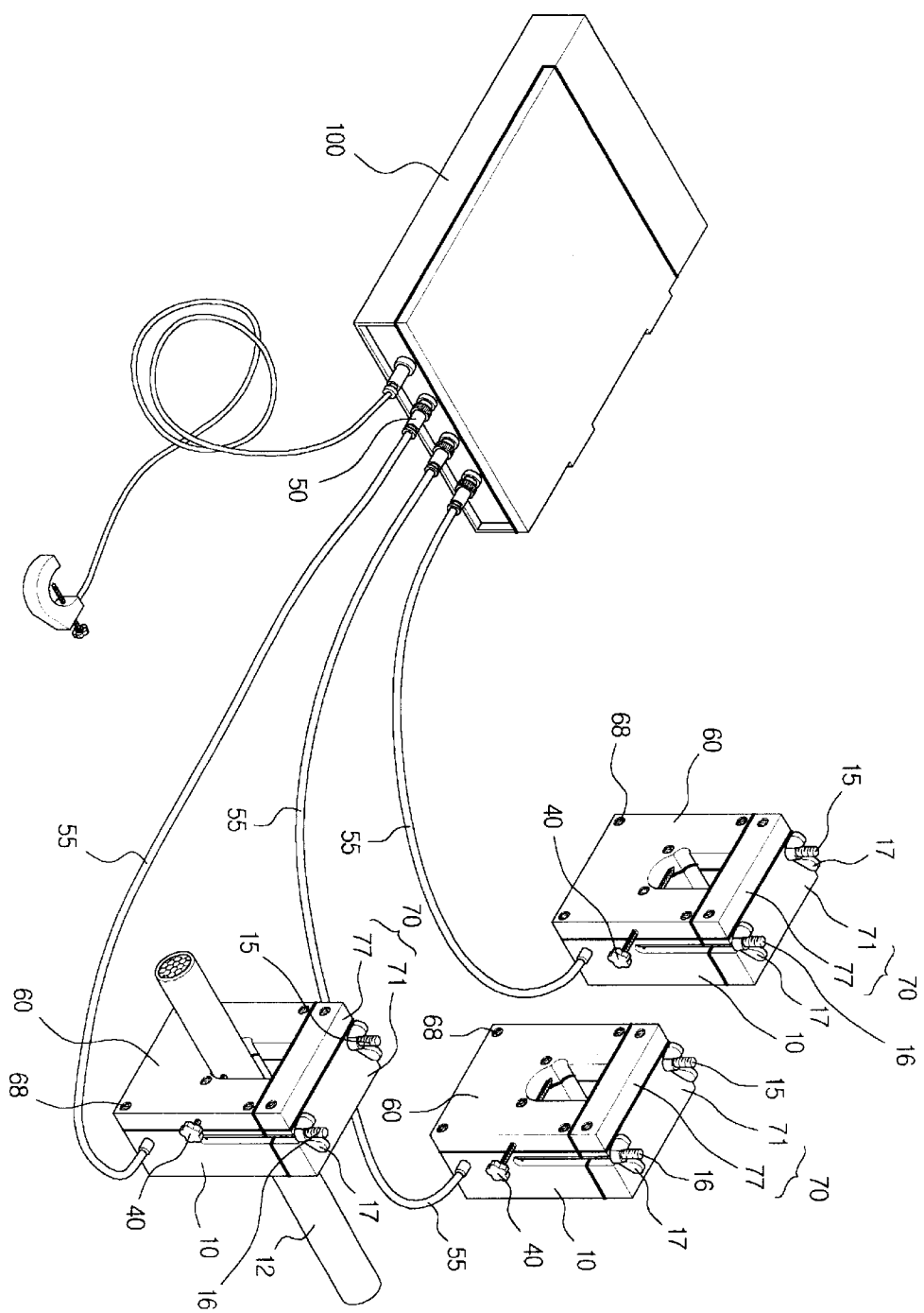
FIG. 3 is a perspective view showing the using state of the probe for measuring voltage/current of a low voltage power distribution cable, which is connected to a load monitoring system of a pole transformer.
Figure 4:
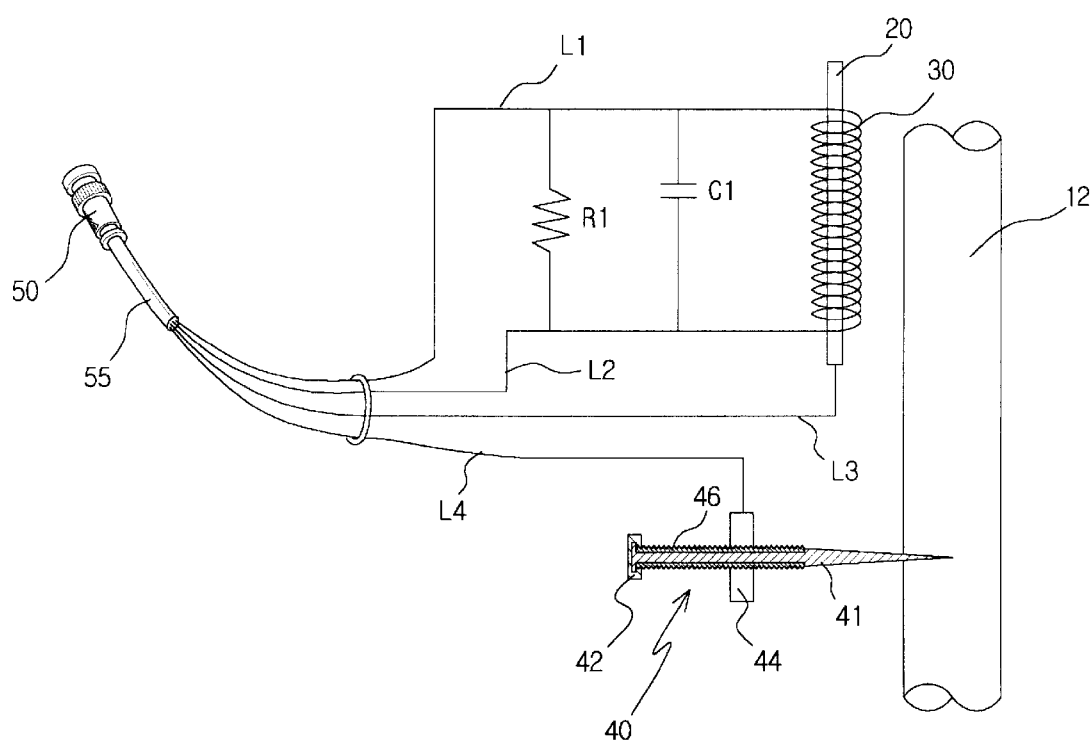
FIG. 4 is a circuit diagram of the probe for measuring voltage/current of a low voltage power distribution cable according to a preferred embodiment of this invention.

FIG. 1 is a perspective view showing a probe for measuring voltage/current of a low voltage power distribution cable according to a preferred embodiment of this invention, and FIG. 2 is an exploded perspective view of the probe of FIG. 1. FIG. 3 is a perspective view showing the using state for using the probe for measuring voltage/current of a low voltage power distribution cable, which is connected to a load monitoring system of a pole transformer, and FIG. 4 is a circuit diagram of the probe for measuring voltage/current of a low voltage power distribution cable according to a preferred embodiment of this invention.

Referring to FIGS. 1 to 4, in the probe for measuring the voltage/current of a low voltage power distribution cable according to the preferred embodiment of this invention, a body 10 is made of an insulating material in which an opening 13 for receiving a low voltage power distribution cable 12 is upwardly formed and a recess 14 having a U shape is formed around the opening 13.

A lower core 20 having a U shape is inserted into the recess 14 of the body 10 and an insulating material is installed in the lower core 20, such that a coil 30 is wound around the insulating material so as to detect an induction current induced by current flowing through the low voltage power distribution cable 12. Further, a capacitor C1 is connected between both end output lines L1 and L2 extended from the coil 30 to be parallel with the coil 30 so as to filter out noise components, and an output resistor R1 is connected in parallel with both the capacitor C1 and coil 30.

Further, the lower core 20 is connected to one end of a ground line L3. A voltage detection terminal 40 is installed such that it is electrically connected to the low voltage power distribution cable 12 by penetrating through a via hole 64 formed on the side surface of an end plate 60 attached to the body 10 and a nut 44 inserted into a recess 62 so as to detect voltage generated in the low voltage power distribution cable 12.

An output line L4 used for outputting the detected voltage is connected to the voltage detection terminal 40, and a connector 50 is connected to output sides of the both end output lines L1 and L2, the ground line L3 and the output line L4.

An opening 63 having approximately the same shape as that of the opening 13 formed in the body 10 is formed in the end plate 60 for covering the recess 14 of the body 10. The end plate 60 covers the coil 30 installed in the recess 14 of the body 10. Additionally, in the end plate 60, the U-shaped recess 62 for receiving the nut 44 interlocked with the voltage detection terminal 40 is formed. A top cover 70 is mounted to the top surfaces of the body 10 and the end plate 60 by respectively interlocking the wing nuts 17 with a screw part of a fixed bolt 15 penetrating through a via hole 74 formed at a top cover 70 and a movable bolt 16 received in a slot 18 formed on the side surface of the body 10. An upper core 80 is inserted into a groove (not shown) of the top cover 70 to be opposite to the lower core 20 installed in the body 10.

In other words, the slot 18 is vertically formed on the side surface of the body 10 and opened at the top surface of the body 10 such that the movable bolt 16 rotating around a hinge pin 16a is inserted into the slot 18.

The top cover 70 is comprised of a top cover body 71 in which the upper core 80 is fixedly inserted, and a top side cover 79 in which screw holes 79a are formed to allow screws 77 to fasten the top side cover 79 to the top cover body 71 together with the screw holes 71a formed in the top cover body 71.

The top cover body 71 is comprised of a recess (not shown) in which the upper core 80 is inserted, a via hole 74 in which the fixed bolt 15 fixedly mounted to the body 10 is penetrated, and a slot 78 formed to be extended from the slot 18 of the body 10 and correspond to the slot 18 so as to receive the movable bolt 16 to be rotated.

In the voltage detection terminal 40, a pointed front end 41 is formed such that it is electrically connected to the low voltage power distribution cable 12 through the via hole 64 formed on the side surface of the end plate 60 and the nut 44 inserted into the recess 62 having a U shape. Further, a knob 42 is formed at the rear end of the voltage detection terminal 40. The remaining part of the voltage detection terminal 40 except for the pointed front end 41 is coated with an insulating material 46 externally threaded in order to prevent an electric shock.

In the above description, the body 10, the end plate 60 and the top cover 70 are preferably each made of an insulating material so as to prevent electric shock.

Hereinafter, the operation and effect of the probe for measuring the voltage/current of a low voltage power distribution cable 12 is described in detail.

First, a bobbin (not shown) made of an insulating material is installed at the center portion of the lower core 20 to be fixed. Then, the coil 30 is wound around the bobbin, and the capacitor C1 for noise filtering is connected between the both end output lines L1 and L2 extended from the coil 30 to be parallel with the coil 30, and the resistor R1 is connected between the both end output lines L1 and L2 to be parallel with the coil 30 and the capacitor C1. At this time, a cable 55 whose one end is connected to the connector 50 to be fixed is inserted into a via hole (not shown) formed on the side surface of the body 10, such that two wires of the cable 55 are electrically connected to both end output lines L1 and L2. Further, one other wire of the cable 55 is electrically connected to the lower core 20 through the ground line L3. Still another wire of the cable 55 is electrically connected to the voltage detection terminal 40 through the output line L4 and the nut 44.

Next, the lower core 20, the coil 30, the capacitor C1 and the resistor R1 are inserted into the recess 14 formed on the front surface of the body 10. At this time, the nut 44 is fixed to the upper portion of the recess 62 formed in the end plate 60, and then the end plate 60 is attached to the body 10 by interlocking using the setscrews 68.

Next, the fixed bolt 15 fixedly mounted to the body 10 is inserted into the via hole 74 formed on the top cover 70 constructed by mounting the top side cover 79 to the top cover body 71 using the screws 77, and at the same time the upper portion of the movable bolt 16 is inserted in the slot 78. Thereafter, the fly nuts 17 are interlocked with screw portions of the fixed bolt 15 and the movable bolt 16, such that the top cover 70 is mounted to top surfaces of both the body 10 and the end plate 60.

If the voltage detection terminal 40 is rotated clockwise into the via hole 64 formed toward the center portion on a side surface of the end plate 60, the pointed front end 41 of the voltage detection terminal 40 is penetrated through the nut 44 inserted into the recess 62 of the end plate 60 to project into the opening 63 for receiving the low voltage power distribution cable 12. Therefore, the probe for measuring voltage/current of the low voltage power distribution cable is assembled as shown in FIG. 1.

The connector 50 of the probe for measuring voltage/current of the low voltage power distribution cable assembled as described above is connected to the load monitoring system 100 installed at the pole transformer as shown in FIG. 3. Then, if the fly nuts 17 respectively interlocked with the fixed bolt 15 and the movable bolt 16 are each slightly loosened, and the movable bolt 16 is rotated clockwise around the hinge pin 16a, the movable bolt 16 is positioned perpendicular to the side surface of the body 10.

At this time, the top cover 70 is rotated clockwise or counterclockwise around the fixed bolt 15, such that the low voltage power distribution cable 12 is inserted into the openings 13 and 63 respectively formed in the body 10 and the end plate 60 as shown in FIG. 3. Then, the top cover 70 is returned to the original position.

At this state, after the nut 17 is tightened onto the fixed bolt 15, if the movable bolt 16 is rotated counterclockwise around the hinge pin 16a, the movable bolt 16 is inserted into both the slot 18 of the body 10 and the slot 78 of the top cover 70. After that, if the fly nut 17 is tightened onto the screw portion formed at the movable bolt 16, the top cover 70 is strongly mounted to the top surfaces of the body 10 and the end plate 60.

As described above, after the low voltage power distribution cable 12 is inserted into the openings 13 and 63 respectively formed in the body 10 and the end plate 60, if the knob 42 of the voltage detection terminal 40 inserted into the side surface of the end plate 60 is rotated clockwise, the pointed front end 41 of the voltage detection terminal 40 is penetrated through the covering material of the power distribution cable 12 to be electrically connected to the electric wires within the power distribution cable 12. Thereby, the voltage detection terminal 40 can detect voltage applied to the power distribution cable 12 and output the detected voltage to the load monitoring system 100 through the output line L4, the cable 55 and the connector 50. At this time, because the notches 13a and 63a are respectively formed on the walls of the openings 13 and 63 respectively formed in the body 10 and the end plate 60 so as to fix the position of the low voltage power distribution cable 12, the low voltage power distribution cable 12 can be stably fixed at a predetermined position.

Meanwhile, current is induced in the coil 30 wound around the lower core 20 by current flowing through the low voltage power distribution cable 12, thus allowing current flowing through the low voltage power distribution cable 12 to be detected. Additionally, after the noise component included in the detected current is filtered by the capacitor C1, the detected current is outputted to the load monitoring system 100 through the output lines L1 and L2, the cable 55 and the connector 50.

As described above, the present invention provides a probe for measuring voltage/current of a low voltage power distribution cable, in which a voltage detection terminal and a current detection coil are integrated into one structure so as to simultaneously measure voltage and current of the low voltage power distribution cable, thus allowing the voltage/current of the low voltage power distribution cable to be precisely measured. Further, the present invention is advantageous in that it can simplify the structure of the probe and it can be strongly constructed. Further, in the probe of the present invention, a top cover can be easily rotated around a fixed bolt fixedly mounted to a body of the probe, a movable bolt can be easily positioned perpendicular to the side surface of the body around a hinge pin, the movable bolt is easily inserted into slots formed on the side surfaces of both the body and the top cover, and a nut is interlocked with the screw portion of the movable bolt so as to easily mount the top cover to the top surfaces of the body and the end plate. Therefore, the present invention is highly advantageous in that the low voltage power distribution cable can be easily detached from the probe, and the voltage and current of the power distribution cable can be simultaneously measured.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A probe for measuring voltage/current of a low voltage power distribution cable, comprising:
   a body having a first opening upwardly formed therein for receiving a low voltage power distribution cable and a first recess formed in the shape of a U around the first opening, and made of an insulating material;
   a lower core inserted into the first recess of the body and formed in the shape of a U;
   a coil wound around an insulating material installed at the lower core for detecting an induction current induced by means of current flowing through the low voltage power distribution cable;
   a capacitor connected between both end output lines extended from the coil to be parallel with the coil so as to filter out noise components;
   a resistor connected between the both end output lines extended from the coil to be parallel with the capacitor;
   a ground line electrically connected to one end of the lower core;
   a voltage detection terminal electrically connected to the low voltage power distribution cable for detecting voltage applied to the low voltage power distribution cable;
   a voltage output line for outputting the voltage detected by the voltage detection terminal;
   a connector connected to output sides of the both end output lines extended from the coil, the ground line and the voltage output line;
   an end plate attached to the body for covering the first recess, the end plate being provided with a second opening formed therein in approximately the same shape as the first opening formed in the body and a second recess formed therein in an approximate U shape both to cover the coil mounted in the first recess of the body and to receive a nut interlocked with the voltage detection terminal;
   a top cover mounted to the top surfaces of the body and the end plate by nuts interlocked with a fixed bolt fixedly mounted to the body and a movable bolt; and
   an upper core inserted in the top cover to be opposite to the lower core installed in the body.

2. The probe according to claim 1, wherein the body has a first slot vertically formed and opened at the top surface of the body such that the movable bolt rotatable around a hinge pin is inserted into the first slot.

3. The probe according to claim 1, wherein the top cover includes:
   a top cover body in which the upper core is fixedly inserted; and
   a top side cover in which screw holes are formed to allow screws to fasten the top side cover to the top cover body together with the screw holes formed in the top cover body.

4. The probe according to claim 3, wherein the top cover body includes:
   a groove in which the upper core is inserted;
   a via hole through which the fixed bolt fixedly mounted to the body penetrates; and
   a second slot formed to be extended from a first slot formed in the body so as to receive the movable bolt to be rotated.

5. The probe according to claim 1, wherein the voltage detection terminal is provided with a pointed front end of a metal such that the pointed front end is electrically connected to the low voltage power distribution cable by penetrating through the via hole formed in the side of the end plate and the nut inserted into the second U-shaped recess, and a knob formed at the rear end of the voltage detection terminal,
   wherein the remaining part of the voltage detection terminal except for the pointed front end is coated with an insulating material externally threaded in order to prevent an electric shock.

* * * * *